United States Patent [19]

Miyamoto

[11] Patent Number: 5,371,703
[45] Date of Patent: Dec. 6, 1994

[54] SINGLE-BIT OUTPUT TYPE MEMORY INCLUDING BIPOLAR SELECTION TRANSISTORS

[75] Inventor: Junichi Miyamoto, Yokohama, Japan

[73] Assignee: Kabushiki Kaisha Toshiba, Kawasaki, Japan

[21] Appl. No.: 94,359

[22] Filed: Jul. 21, 1993

Related U.S. Application Data

[63] Continuation of Ser. No. 514,265, Apr. 25, 1990, abandoned.

[30] Foreign Application Priority Data

Apr. 25, 1989 [JP] Japan ............................... 1-105291

[51] Int. Cl.$^5$ ..................... G11C 7/00; G11C 11/413; G11C 11/419
[52] U.S. Cl. .................................. 365/185; 365/177; 365/189.09; 365/189.11; 365/207; 365/208; 365/225.6; 365/230.03; 365/230.06; 365/210
[58] Field of Search ........... 365/177, 184, 185, 189.09, 365/189.11, 189.06, 190, 207, 208, 225.6, 230.03, 230.06, 210; 307/350, 495, 499, 530

[56] References Cited

U.S. PATENT DOCUMENTS

| | | | |
|---|---|---|---|
| 4,237,472 | 12/1980 | Hollingsworth | 365/177 |
| 4,301,518 | 11/1981 | Klass | 365/185 |
| 4,503,520 | 3/1985 | Kyomasu et al. | 365/177 |
| 4,604,533 | 8/1986 | Miyamoto et al. | 307/530 |
| 4,616,342 | 10/1986 | Miyamoto | 365/190 |
| 4,654,831 | 3/1987 | Venkatesh | 365/207 |
| 4,658,159 | 4/1987 | Miyamoto | 307/530 |
| 4,663,741 | 5/1987 | Reinschmidt et al. | 365/225.6 |
| 4,727,517 | 2/1988 | Ueno et al. | 365/203 |
| 4,849,933 | 7/1989 | Allen | 365/96 |
| 4,853,899 | 8/1989 | Kitsukawa et al. | 365/207 |
| 4,858,183 | 8/1989 | Scharrer et al. | 365/174 |
| 4,916,665 | 3/1990 | Atsumi et al. | 365/185 |
| 4,970,687 | 11/1990 | Usami et al. | 365/189.01 |
| 4,970,691 | 11/1990 | Atsumi et al. | 365/189.11 |
| 5,138,579 | 8/1992 | Tatsumi et al. | 365/203 |

FOREIGN PATENT DOCUMENTS

| | | | |
|---|---|---|---|
| 0025303 | 3/1981 | European Pat. Off. | 365/207 |
| 0246125 | 11/1987 | European Pat. Off. | 365/177 |
| 0081685 | 4/1988 | Japan | 365/189.09 |

OTHER PUBLICATIONS

Jacob Millman, Ph.D, "Microelectronics–Digital and Analog Circuits and Systems," pp. 155–159, 186–187.

Primary Examiner—Joseph L. Dixon
Assistant Examiner—Jack A. Lane
Attorney, Agent, or Firm—Banner, Birch, McKie & Beckett

[57] ABSTRACT

Bipolar transistors are used to select memory cells of single-bit line output type. Bit lines are connected to the emitters of the selecting bipolar transistors, respectively. The collectors of the selecting bipolar transistors are connected to one another, thus forming a node. A potential which is higher than the ground potential and lower than a power-supply potential is applied to the gate of any one of the bipolar transistors which has been selected. This potential determines the maximum voltage of the bit lines. A current-sensing amplifier amplifies the difference between a reference potential and the potential of the collector node of the bipolar transistors, thus generating two output signals. A sense amplifier converts these output signals into a signal at a CMOS logic level, whereby the data stored in a selected memory cell is read out. The selected bit line is charged with a current flowing from the current-sensing amplifier circuit through the collector-emitter path and base-emitter path of the selecting bipolar transistor.

27 Claims, 11 Drawing Sheets

SINGLE-BIT OUTPUT TYPE MEMORY INCLUDING BIPOLAR SELECTION TRANSISTORS

This application is a continuation of application Ser. No. 07/514,265, filed Apr. 25, 1990, now abandoned.

BACKGROUND OF THE INVENTION

1. Field of the Invention

The present invention relates to a semiconductor memory device from which data can be read at high speed, and more particularly to a semiconductor memory device of single-bit line output type, such as a nonvolatile semiconductor memory device.

2. Description of the Related Art

FIG. 1 illustrates the data-reading section of a known nonvolatile semiconductor memory (EPROM) of single-bit line output type. As is shown in this figure, the memory cell array 11 of the EPROM comprises memory cells MC11, MC12, ... MC21, MC22, ... each memory cell comprises a floating-gate MOSFET and the memory cells are arranged in rows and columns. The drains of the memory cells MC of each column are connected to a bit line (BL1, BL2, ...). The source of every memory cell MC is connected to the ground Vss. The control gates of the cells MC of each row are connected to a word line (WL1, WC2, ...). The word lines WL1, WL2, ... are connected to a row decoder (not shown), thereby to receive the signals output from the row decoder.

The memory cell array further comprises a Y selector having N-channel MOS transistors 12-1, 12-2. The current paths of these MOS transistors are connected at one end to the bit lines BL1, BL2, ..., and at the other end to each other. The gates of the MOS transistors 12-1, 12-2 .... are connected to a column decoder (not shown) to receive the signals output from the column decoder. The cell array also has an N-channel charging MOS transistor 13A, an N-channel clamping MOS transistor 14A, a sense line 15A, and a P-channel load MOS transistor 16A. The current path of the charging MOS transistor 13A is connected between a power supply vcc and the node of the MOS transistors 12-1, 12-2, ... of the Y selector. The current path of the clamping MOS transistor 14A is connected the node of the MOS transistors 12-1, 12-2, ... and one end of the sense line 15A. The current path of the P-channel load MOS transistor 16A is connected between the sense line 15A and the power supply Vcc. The gate of the MOS transistor 16A is connected to the sense line 15A.

The EPROM further comprises a dummy cell DMC, a dummy bit line DBL, an N-channel MOS transistor 12D, an N-channel charging MOS transistor 13B, an N-channel clamping MOS transistor 14B, a reference line 15B, and a P-channel load MOS transistor 16B. The source and control gate of the dummy cell DMC are connected to the ground Vss and the power supply Vcc, respectively. The dummy cell DMC is of the same size as the memory cells MC as in the case of most nonvolatile semiconductor memories. The drain of the dummy cell DMC is connected by the dummy bit line DBL to the source of the N-channel MOS transistor 12D which has the same size as the MOS transistors 12-1, 12-2 ... of the Y selector. The gate of the MOS transistor 12D is connected to the power supply Vcc. The current path of the charging MOS transistor 13B is connected between the drain of the MOS transistor 12D and the power supply Vcc. The current path of the N-channel clamping MOS transistor 14B is coupled between the drain of the MOS transistor 12D and one end of the reference line 15B. The current path of the load MOS transistor 16B is connected between the reference line 15B and the power supply vcc. The gate of the load MOS transistor 16B is connected to the reference line 15B. The load MOS transistor 16B has a conductance greater than that of the load MOS transistor 16A, whereby a potential difference is present between the sense line 15A and the reference line 15B.

As is shown in FIG. 1, the EPROM further comprises a differential amplifier 17 and a bias circuit 18. The bias circuit 18 applies a bias voltage vbb to the gates of the MOS transistors 13A, 14A, 13B, and 14B, thereby to suppress the writing errors which would otherwise be likely to occur while data is being read from the EPROM. By virtue of the bias voltage applied from the circuit 18, the potentials of the bit lines BL1, BL2, ... will not increase above 1.2V to 1.5V. The differential amplifier 17 has two inputs, which are connected to the other end of the sense line 15A and the other end of the reference line 15B, respectively. The differential amplifier 17 amplifies the difference between the potential of the sense line 15A and that of the reference line 15B, and produces an output representing this potential difference. The potential of the sense line 15A is the voltage which the load MOS transistor 16A has converted from the conductance of any memory cell MC selected. The potential of the reference line 15B is the voltage which the load MOS transistor 16B has converted from the conductance of the dummy cell DMC. Hence, the output of the amplifier 17 is proportional to the difference between the conductance of any selected memory cell MC and that of the dummy cell DMC.

Each memory cell MC stores a "0" bit if it has a cell current Imc of 0 $\mu$A, or a "1" bit if it has a cell current Imc of 100 $\mu$A. If any selected memory cell MC stores a "1" bit—that is, if electrons have been injected into the floating gate of the memory cell MC, the threshold voltage of the memory cell MC is high, and the conductance thereof is also high. In this case, the potential of the sense line 15A is higher than that of the reference line 15B. If the selected memory cell MC stores a "0" bit—that is, if no electrons have been injected into the floating gate of the memory cell MC, the threshold voltage of the cell MC is low, and the conductance thereof is also low. In this case, the potential of the sense line 15A is lower than that of the reference line 15B. In either case, the differential amplifier 17 amplifies the difference between the potentials of the lines 15A and 15B, thereby reading data from the selected memory MC.

The access speed of the circuit shown in FIG. 1 greatly depends on the time required to read data from a memory cell MC storing a "0" bit after data has been read from a memory cell MC connected to the same word line WL and storing a "1" bit. The "1" bit is read from the selected memory cell in the following manner. First, the word line WL, to which the target memory cell MC storing a "1" bit, is connected is selected. Then, a potential is applied to this word line WL. Next, the bit line BL to which the target memory cell MC is discharged to the ground potential, whereby the "1" bit is read from the memory cell MC. To read the "0" bit thereafter from a memory cell MC connected to the same word line WL, it takes much time to increase the potential of the bit line BL, to which this memory cell MC is connected, to a value equal greater than that of the reference line 15B.

FIG. 2 is a graph representing how the potentials of the bit line BL, the sense line 15A and the reference line 15B change with time. As this figure shows, the potential VBL of the bit line BL increases for time t1, from 0V to the value V1 determined by the bias voltage vbb applied from the bias circuit 18, and remains at this value v1 thereafter. The potential V15A of the sense line 15A increases in the same way as the potential VBL, for a period of time t1, and keeps increasing thereafter since it is not clamped by the bias voltage Vbb. Upon lapse of time t2, the potential V15A reaches the potential V15B of the reference line 15B. At this time the output data of the differential amplifier 17 changes from "1" to "0." The delay time t1 and the delay time t2 are determined mostly by Cv/i, where C is parasitic capacitance, v is a potential difference, and i is a current.

The capacitance C, which determines the delay time t1, is in turn determined by the parasitic capacitance of the bit line BL, the parasitic capacitance present between the semiconductor substrate and the drain region of the selecting MOS transistor 12, and the parasitic capacitance coupled to that input node of the amplifier 17 which is connected to the sense line 15A. The current i, which is another determinant of the delay time time t1, is the sum of the current is supplied from the load MOS transistor 16A and the current is supplied from the charging MOS transistor 13A. The potential difference V, i.e., the third determinant of the delay time t1, is the difference v1 between the ground potential and the potential VBL of the bit line BL. The parasitic capacitance of the bit line BL and that of the selecting MOS transistor 12 tend to increase in proportion to the storage capacity of the EPROM. The current i1 supplied from the load MOS transistor 16A is determined by the conductance of the memory cells MC, and therefore decreases in inverse proportion to the size of the memory cells MC.

The parasitic capacitance determining the delay time t2 is, in turn, determined by four determinants. These determinants are: the parasitic capacitance present between the semiconductor substrate and the gate electrode of the load MOS transistor 16A; the parasitic capacitance present between the semiconductor substrate and the drain region of the transistor 16A; the input capacitance of the differential amplifier 17; and the parasitic capacitance present between the semiconductor substrate and the drain region of the clamping MOS transistor 14A. The current i, which is the second determinant of the delay time t2, is the current il flowing the current path of the load MOS transistor 14A. The greater the dimensions of the clamping MOS transistor 14A, the larger the current Il1. Nevertheless, the delay time t2 cannot necessarily be shortened since the parasitic capacitance present between the semiconductor substrate and the drain region of the transistor 14A increases in proportion to the dimensions thereof.

As may be understood from the above, with the conventional EPROM it is difficult to shorten the delay time t1 or the delay time t2 to enhance the access speed, because of the parasitic capacitances increased and also because of the memory-cell conductance decreased due to the reduced dimensions of each memory cell.

SUMMARY OF THE INVENTION

Accordingly, the object of the present invention is to provide a semiconductor memory device of single-bit line output type, from which data can be read at high speed.

To attain the object, a semiconductor memory device according to the invention comprises a memory-cell array having memory cells of single-bit output type, arranged in rows and columns, and a plurality of selecting bipolar transistors having emitters coupled to the drains of the memory cells, collectors connected to one another, and bases connected to receive select signals, whereby data stored in the memory cells can be read from the node of the collectors of the bipolar transistors.

Each bit line of the semiconductor memory device is precharged with the currents flowing, respectively, in the collector-emitter path and base-emitter path of the selecting bipolar transistor connected to the bit line. Hence, the bit line can be precharged at high speed, making it possible to read data from each memory cell at high speed.

DETAILED DESCRIPTION OF THE PREFERRED EMBODIMENTS

Figure 3:
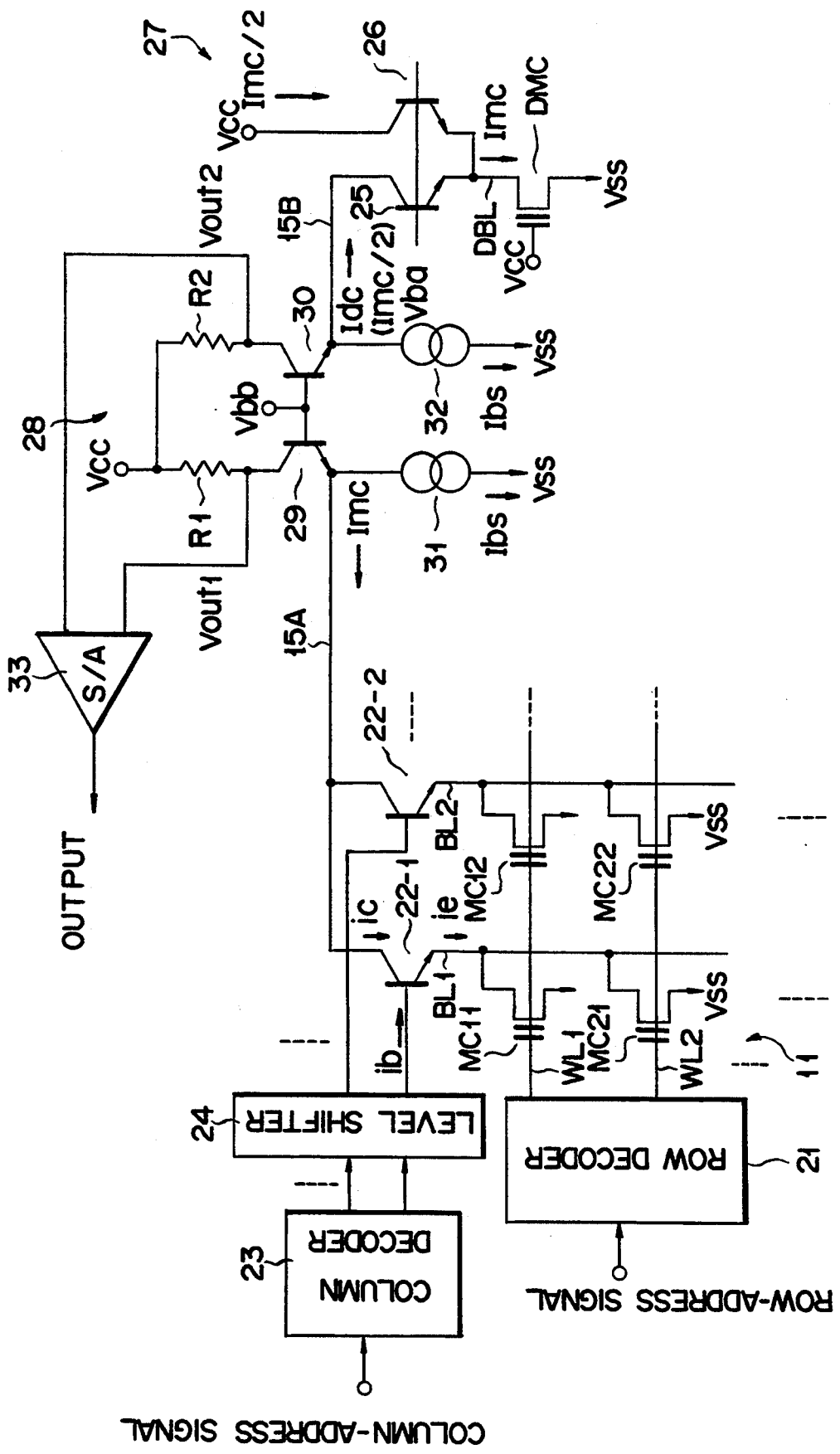
FIG. 3 is a circuit diagram schematically showing the data-reading section of a semiconductor memory device according to a first embodiment of the present invention.

FIG. 3 illustrates a semiconductor memory according to a first embodiment of the invention. As is shown in this figure, the memory cell array 11 of this device comprises memory cells MC11, MC12, ..., MC21, MC22, .... which are floating-gate MOSFETs and arranged in rows and columns, the drains of the memory cells MC of each column are coupled to a bit line BL, and the sources of these memory cells MC are connected to the ground Vss. The control gates of the memory cells MC of each row are connected to a word line WL. The word lines WL1, WL2, are connected to a row decoder 21 to receive the decoded row-address signals from the row decoder 21.

The semiconductor memory has a Y selector which has NPN transistors 22-1, 22-2, ... The emitters of the transistors 22-1, 22-2, ... are connected to bit lines BL1, BL2, ..., and the collectors thereof are connected to one end of a sense line 15A. The base of the NPN transistors 22-1, 22-2, ... are connected to a column decoder 23 to receive decoded column-address signals supplied from the decoder 23 through a level shifter 24. The level shifter 24 changes the decoded column-address signals at CMOS logic levels, which have been output from the column decoder 23. To be more specific. the shifter 24 changes a logic "1" level (i.e., power-supply potential Vcc) to a potential Vba of, for example, 2V which is somewhere between the power-supply potential Vcc and the ground potential vss, and changes a logic "0" level (i.e., the ground potential Vss) to 0V. The logic "1" level is shifted to the potential Vba in order to prevent soft errors from occurring when the drain voltages of the memory cells MC are excessively high.

Row-address signals are input the row decoder 21, and are decoded thereby. Column-address signals are input to the column decoder 23, and are decoded thereby.

The semiconductor memory has a dummy cell DMC having a source connected to the ground vss and a control gate applied with the power-supply potential Vcc. The dummy cell DMC has the same size as the memory cells MC. The drain of the dummy cell DMC is connected by a dummy bit line DBL to the emitters of NPN transistors 25 and 26. The collector of the NPN transistor 25 is coupled to one end of the sense line 15B. The collector of the NPN transistor 26 is coupled to the power-supply potential Vcc. The bases of the NPN transistors 25 and 26 are connected to each other. A bias voltage vba is applied to the bases of these transistors 25 and 26. The bias voltage Vba is substantially equal to the voltage applied to the bases of the selecting NPN transistors 22-1, 22-2, ... to select these transistors 22-1, 22-2, ... The dummy cell DMC and the NPN transistors 25 and 26 constitute a circuit 27, which generates and applies a reference potential V15B to a reference line 15B.

It should be noted that the NPN transistors 25 and 26 have the same emitter area. A current Imc is supplied to the sense line 15A from the emitter of a transistor 29, and a current Idc is supplied to the reference line 15B from the emitter of a transistor 30. The current Idc is half the current Imc, that is, Idc=Imc/2. Hence, a current of Imc/2 flows in the collector-emitter path of the transistor 25; a current of Imc/2 flows in the collector-emitter path of the transistor 26; and a current of Imc flows in the drain-source path of the dummy cell DMC.

The semiconductor memory further comprises a current-sensing amplifier 28 having two inputs, which are coupled to the other end of the sense line 15A and the other end of the reference line 15B. The amplifier 28 comprises the NPN transistors 29 and 30, load resistors R1 and R2, and constant current sources 31 and 32. The emitters of the NPN transistors 29 and 30 are coupled to the other ends of the lines 15A and 15B, respectively. The bias voltage Vbb is applied to the bases of the NPN transistors 29 and 30. The current source 31 is connected between the emitter of the NPN transistor 29 and the ground Vss, and the current source 32 is connected between the emitter of the NPN transistor 30 and the ground Vss. The load resistor R1 is coupled between the collector of the NPN transistor 29 and the power supply Vcc, and the load resistor R2 is connected between the collector of the NPN transistor 30 and the power supply vcc. The emitters of the transistors 29 and 30 serve as input nodes of the amplifier 28, whereas the collectors of the transistors 29 and 30 function as output nodes of the amplifier 28.

Figure 4:
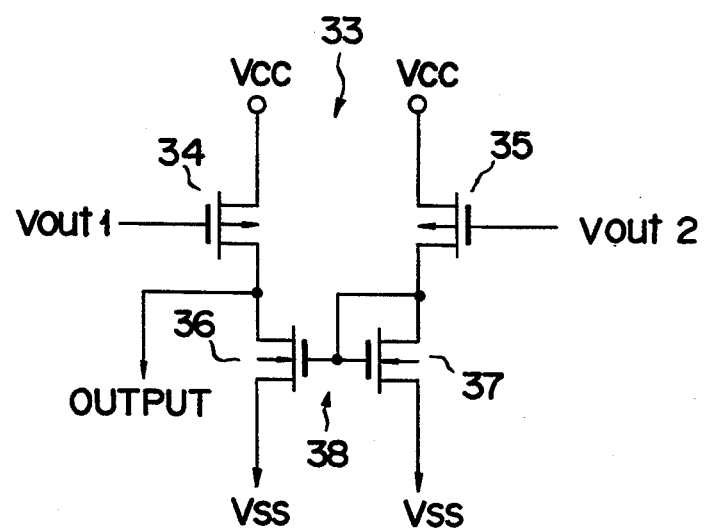
FIG. 4 is a circuit diagram illustrating the differential amplifier incorporated in the memory device illustrated in FIG. 3.

The two output signals Vout1 and Vout2 supplied from the current-sensing amplifier 28 are input to a differential amplifier 33. The amplifier 33 compares the signals Vout1 and Vout2 and amplifies the difference between these input signals, thereby reading the CMOS logic level of the data stored in any memory cell MC selected. 10 FIG. 4 shows the differential amplifier 33. As is illustrated in this figure, the amplifier 33 comprises two P-channel MOS transistors 34 and 35 and a current mirror circuit 38 constituted by two N-channel MOS transistors 36 and 37. The gates of the P-channel MOS transistors 34 and 35 are connected to the outputs of the current-sensing amplifier 28 to receive the output signals Vout1 and Vout2. The sources of the MOS transistors 34 and 35 are connected to the power supply Vcc. The drains of the MOS transistors 34 and 35 are connected to the ground Vss, thus forming two nodes. The current mirror circuit 38 is connected between these nodes. A signal at a CMOS logic level is output from the node of the MOS transistors 34 and 36.

The operation of the semiconductor memory illustrated in FIG. 3 will now be explained. A potential Vba is applied to the base of one of the selecting NPN transistors 22-1, 22-2, ... When this potential vba is 0V, no memory cells MC, coupled to the bit line BL to which the selecting NPN transistor is coupled, are selected. When the potential is about 2V, the memory cells MC coupled to the bit line BL are selected. In the latter case, the bit line BL is clamped at a potential which is at most, 1.3V or (2−Vf)V, where Vf is the base-emitter voltage of the NPN transistors 22-1, 22-2, ...

Assuming that the potential of the bit line BL increases from 0V, which is the worst case in terms of the access speed of the semiconductor memory, the bit line BL is charged from 0V to 1.3V as the base potential of the selected NPN transistor 22 increases from 0V to 2V. The charging current ie is the sum of the collector current ic and base current ib of the transistor 22. The collector current ic, which is determined by the conductance of the memory cells MC, is approximately (i1+i2) as in the conventional semiconductor memory. The bit line BL can be quickly charged, nevertheless, from 0V to 1.3V. This is because, a great base current ib is supplied to the base of the NPN transistor 22, causing the collector current ic to flow to the bit line BL through the low-conductance path constituted by the resistor R1, the collector-emitter path of the NPN transistor 29 and the collector-emitter path of the NPN transistor 30.

Let us now see how the potential V15A of the sense line 15A changes. The potential V15A is defined, as follows, by the parameters of the current-sensing amplifier 28:

$$V15A = Vbb - \frac{kT}{q} \ln\left(\frac{Ibs + Imc}{io}\right)$$

where io is the saturated current of a diode, and kT/q is a voltage which is about 25 mV at room temperature. The current Ibs supplied from the constant current sources 31 and 32 is substantially the same as the current Imc flowing via the sense line 15A. It follows that the potential the sense line 15A has if the selected memory cell MC stores a "0" bit (Imc=0V) differs from the potential the line 15A has if the selected memory cell MC stores a "1" bit (Imc=Ibs), by ΔV15A which is given as:

$$\Delta V15A = \frac{kT}{q} \ln 2 = 17 \text{ mV}$$

Figure 1:
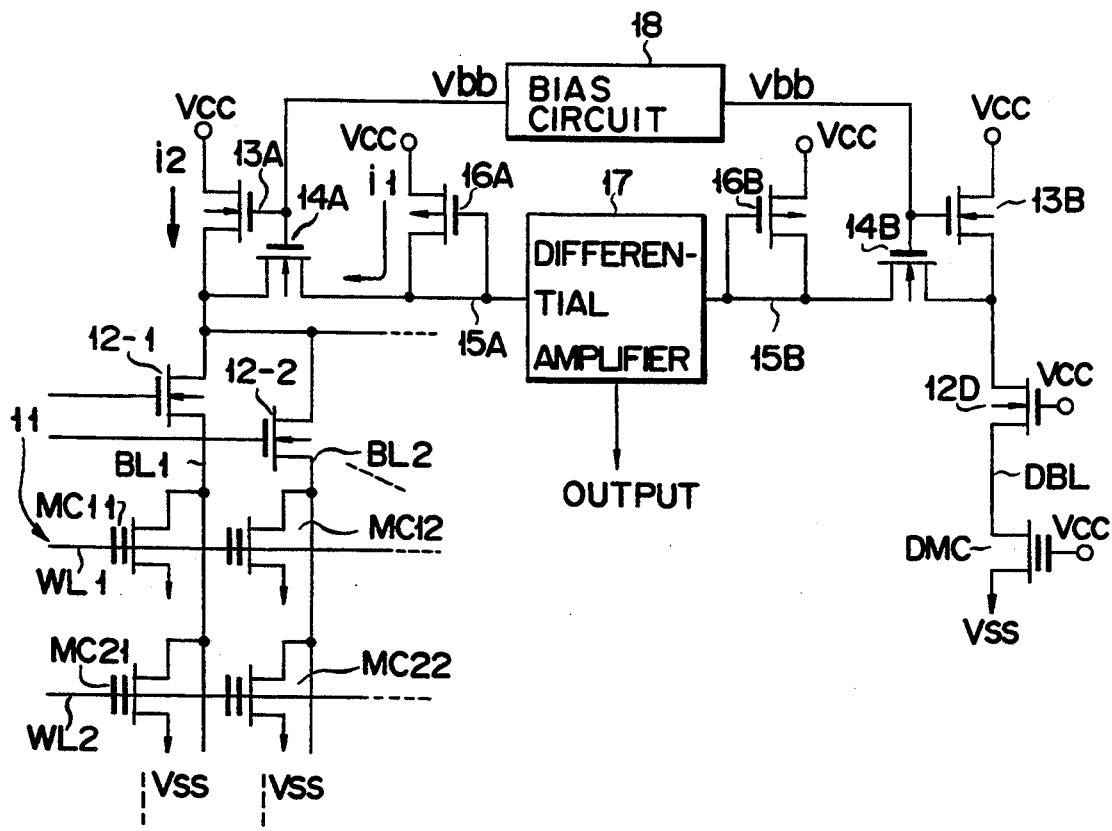
FIG. 1 is a circuit diagram schematically showing the data-reading section of a known EPROM.
Figure 2:
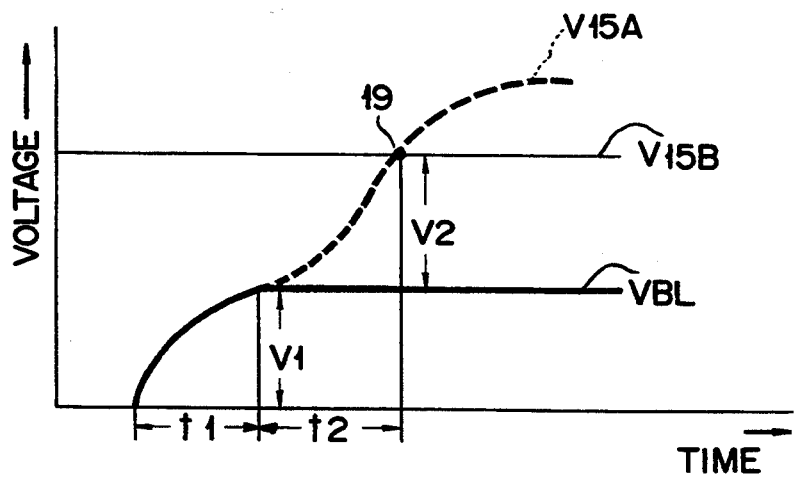
FIG. 2 is a graph explaining the operation of the EPROM shown in FIG. 1, more precisely, representing how the potentials of each bit line, the sense line and the reference line change with time.

The delay time t2 in the conventional circuit shown in FIG. 1 has the following value when V2 is 1.7V:

$$t2 = Cv2/i1 = 1.7C/(Imc/2) = 3.4C/Imc$$

In contrast, the delay time t2 in the circuit shown in FIG. 3, or the delay time t2', has the following value when V2 is 1.7V:

$$t2' = C \cdot 17mV/Imc$$

Assuming that the parasitic capacitance C is the same in the conventional circuit (FIG. 1), the delay time t2' is 1/200 of the delay time t2. Needless to say, not only the time t2' but also the delay time of the amplifier 33 is required in order to read data from any selected memory cell MC. The time delay of the amplifier 33, however, is far shorter than the delay time t1 or t2, because the potential difference which the amplifier 33 amplifies to 5 v is as high as 0.5 V to 1 v, not a few millivolts as in the case of the circuit shown in FIG. 1.

Therefore, data can be read from the memory of the invention (FIG. 3) at higher speed than from the conventional memory shown in FIG. 1.

The first output Vout1 and second output Vout2 of the current-sensing amplifier 28 are given as follows:

$$Vout1 = Vcc - R1 \quad (Ibs + Imc)$$

$$Vout2 = Vcc - R2 \quad (Ibs + Imc)$$

An approach, which can be taken to make a greater difference between these outputs Vout1 and Vout2 while the selected memory cell MC is on, is that approach actually taken in the conventional memory (FIG. 1), that is, to set the value of Imc to Idc and use a load MOS transistor 16A whose conductance (r16A) is less than that (r16B) of the load MOS transistor 16B. However, it is better to make r16A and r16B equal and change the dummy cell current Idc to KIdc (0<K<1), in order to maintain the symmetry of the differential amplifier 33 in terms of component characteristics. This is why K is set to 0.5 in the circuit 27 for generating the reference potential V15B. Thus, Vout1 - Vout2=0.5·r·Imc, and a sufficient difference is made between the outputs Vout1 and Vout2 of the current-sensing amplifier 28.

Figure 5:
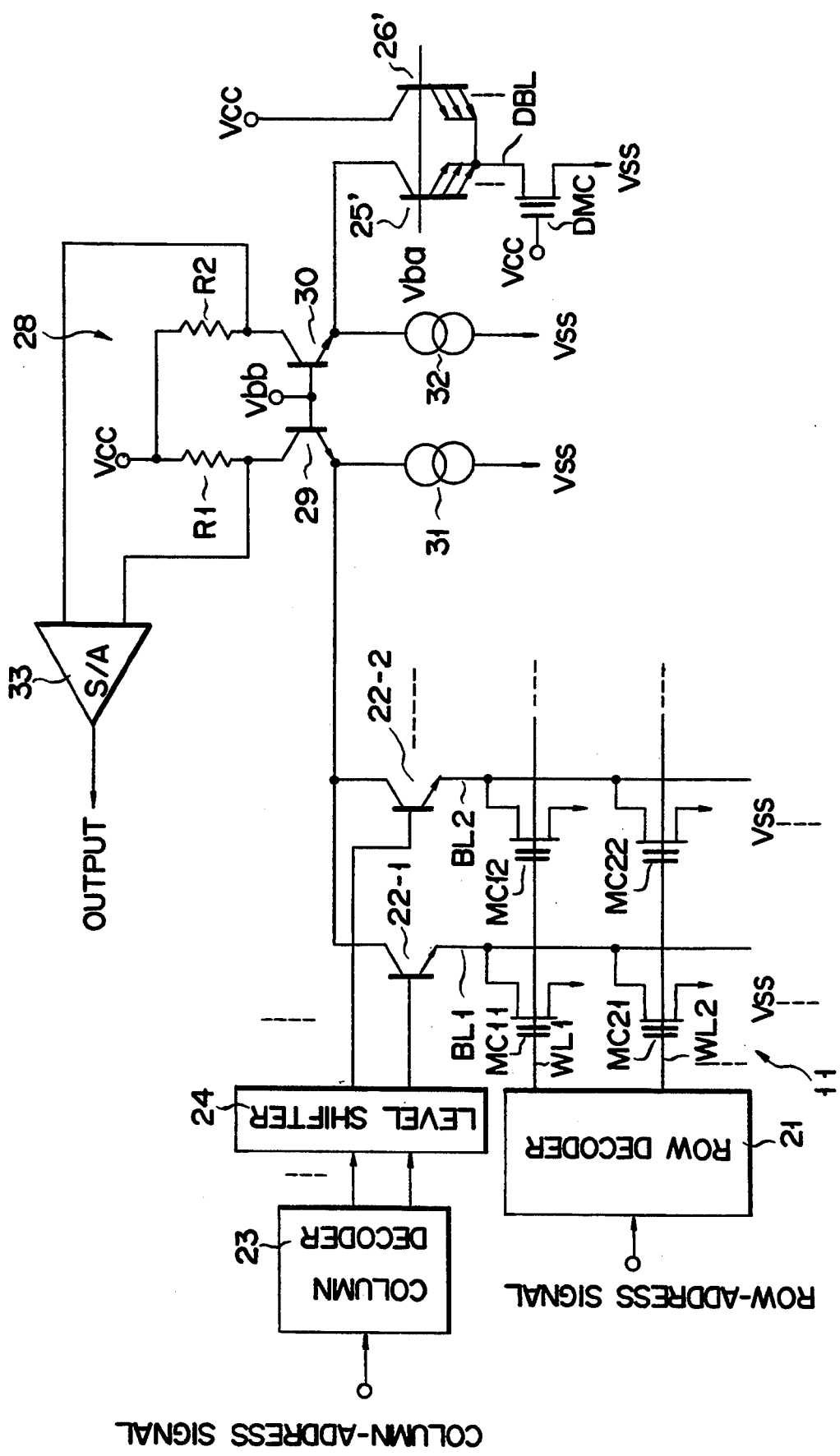
FIGS. 5, 6, and 7 are circuit diagrams schematically illustrating the data-reading sections of three memory device according to a second, a third, and a fourth embodiment of the invention, respectively.

If it is necessary to render the "0"-side margin and "1"-side margin imbalanced, for design purposes, the circuit 27 may be modified as is illustrated in FIG. 5. In the circuit 27 shown in FIG. 5, K can be set to any desired value. This circuit either comprises NPN transistors 25' and 26' having emitters of different sizes m and n, or m emitters and n emitters, respectively all emitters having the same size. In either case, the emitter currents for the "0"-side and the "1"-side are mSe and $$e^{\frac{q}{kT} VBE} \text{ and } nSe \ e^{\frac{q}{kT} VBE}$$

(Se is the area of each emitter of the multi-emitter transistors 25' and 26'), provided that the base-emitter currents for the "0"-side and the "1"-side are identical. If both NPN transistors 25' and 26' have a sufficiently large current amplification factor β, the emitter current and collector current of either NPN transistor are substantially the same. Hence, the current flowing in the input node the current-sensing amplifier 28 is: [m/(m+n)] Imc.

Figure 6:
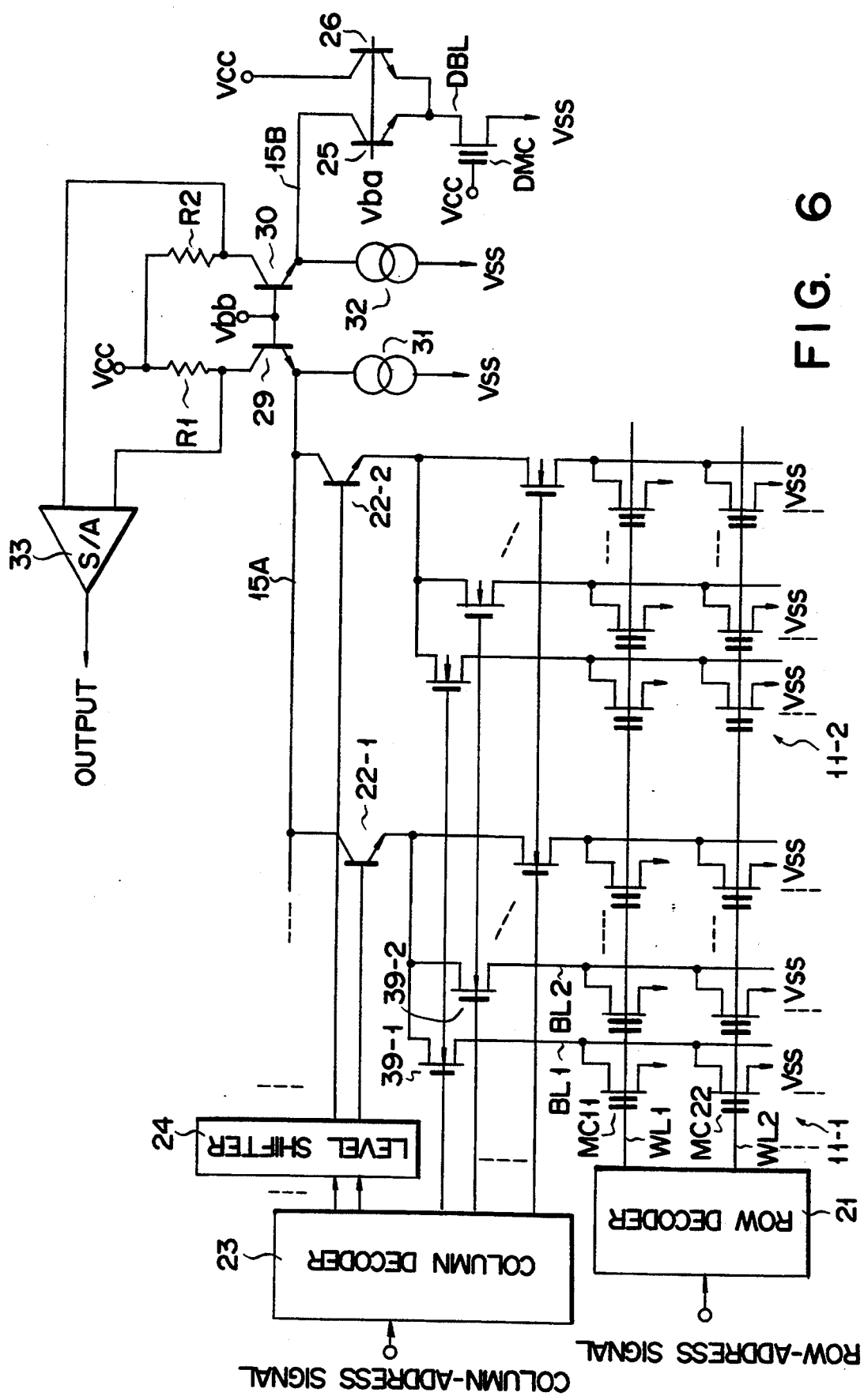

Generally, an NPN bipolar transistor is larger than a MOS transistor. In the circuit shown in FIG. 3, the selecting NPN transistors 22-1, 22-2, ... may not be arranged at so short intervals as the memory cells MC, which are MOS transistors. If this is the case, the memory-cell array 11 can be divided into blocks 11-1, 11-2, ... as is illustrated in FIG. 6, and the NPN transistors 22-1, 22-2, ... can be provided for these cell-array blocks 11-1, 11-2, ... respectively. More specifically, the sources of N-channel MOS transistors 39-1, 39-2, ... are connected to bit lines BL1, BL2, and the drains of the N-channel MOS transistors of each block are connected to one another. The node of the drains of the N-channel MOS transistors of the first block is coupled to the emitter of the NPN transistor 22-1; the node of the drains of the N-channel MOS transistors of the second block is connected to the emitter of the NPN transistor 22-2; and so forth. The collectors of the transistors 22-1, 22-2, ... are connected to a sense line 15A. The gates of the N-channel MOS transistors 39-1, 39-2, ... of each cell-array block are connected to a column decoder 23, so that the memory cells MC of the columns corresponding to the N-channel MOS transistors 39-1, 39-2, ... are selected at the same time in accordance with the lower bits of a decoded column address output from the column decoder 23. The bases of the NPN transistors 22-1, 22-2, ... are connected to a level shifter 23 to receive the signals output from the level shifter 24. The level shifter 24 is connected to the column decoder 23 to receive the upper bits output from the decoder 23.

The semiconductor memory shown in FIG. 6 operates in the following way. When any NPN transistor 22 is selected, it in turn selects the corresponding cell-array block. The MOS transistors 39-1, 39-2 .... of provided for this cell-array block therefore select the columns of memory cells MC of the selected block. As has been described, the MOS transistors 39-1, 39-2, ... are controlled directly by the upper bits of the decoded column address supplied from the column decoder 23, which are signals at 0 V to 5 V. Nevertheless, the potentials of the bit lines BL are clamped at approximately 1.2V. This is because the base potentials of the NPN transistors 22-1, 22-2, ... are not higher than about 2V.

In the memory device shown in FIG. 6, it suffices to use the NPN transistors 22-1, 22-2, ... for the cell-array blocks 11-1, 11-2, ..., respectively. Since only one NPN transistor is connected to the plural bit lines BL used in each cell-array block, the NPN transistors 22 can be arranged at so short intervals as the memory cells MC.

Figure 7:
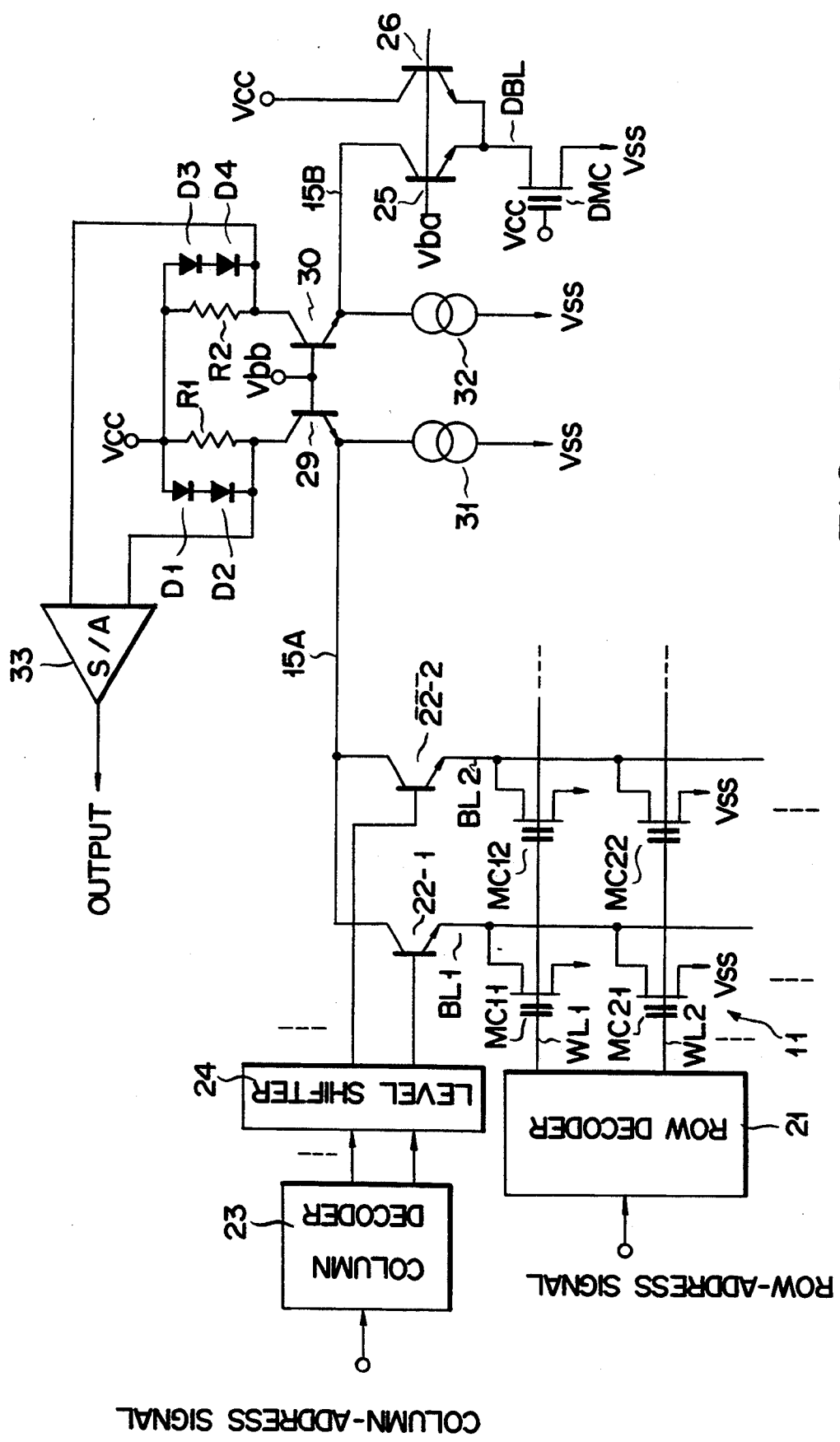

FIG. 7 is a circuit diagram schematically illustrating the data-reading section of a memory device according to a fourth embodiment of the invention. This memory device is identical to the device shown in FIG. 5, except that two series-connected diodes D1 and D2 are connected in parallel to a resistor R1, and two series-connected diodes D3 and D4 are connected in parallel to a resistor R2. The diodes D1 and D2 are connected in the forward direction with respect to the power-supply Vcc. The diodes D3 and D4 are connected also in the forward direction with respect to the power supply vcc. The current, which charges the bit lines BL, flows not only through the resistor R1, but also through the diodes D1 and D2. The current, which charges the dummy bit line DBL, flows not only through the resistor R2, but also through the diodes D3 and D4. The potential difference between the sense line 15A and the reference line 15B can be detected within a time shorter than in the memory device illustrated in FIG. 5.

Figure 8:
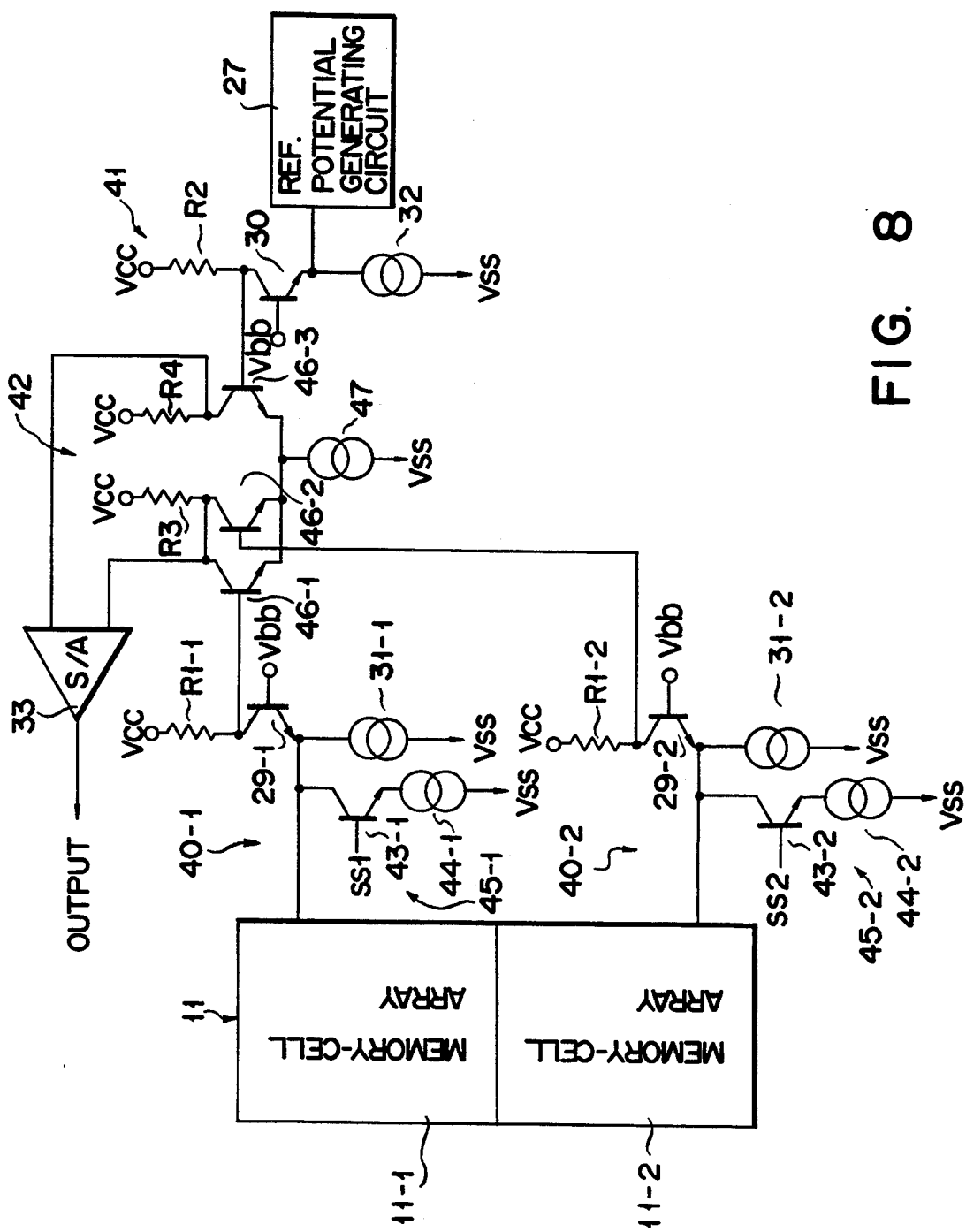
FIG. 8 is a circuit diagram illustrating a semiconductor memory device according to a fifth embodiment of this invention, which includes a current-sensing amplifier of a type other than those used in the other embodiments.

FIG. 8 schematically illustrates the data-reading section of a memory device according to a fifth embodiment of the invention. This memory device has a current-sensing amplifier which is suitable for the case where the bit-line capacitance is large, and the capacitance of each collector dotting node is also large. This current-sensing amplifier comprises two current sensing units 40-1 and 40-2 connected to the memory cell array 11 and one current-sensing unit 41 coupled the circuit 27 for generating a reference potential. The outputs of these current-sensing units 40-1, 40-2, and 41 are multiplexed by means of an ECL gate 42. The output of this gate 42 is amplified by the differential amplifier 33. A selector 45-1 comprised of an NPN transistor 43-1 and a constant current source 44-1 is connected to the current-sensing unit 40-1. A selector 45-2 constituted by an NPN transistor 43-2 and a constant current source 44-2 is connected to the current-sensing unit 40-2.

The ECL gate 42 includes NPN transistors 46-1 to 46-3, load resistors R3 and R4, and a constant current source 47. The base of the NPN transistor 46-1 is connected to the collector of the NPN transistor 29-1. The base of the NPN transistor 46-2 is coupled to the collector of the NPN transistor 29-2. The base of the NPN transistor 46-3 is coupled to the collector of the NPN transistor 30. The resistor R3 is coupled between the power supply Vcc and the node of the collectors of the NPN transistors 46-1 and 46-2. The resistor R4 is connected between the power supply Vcc and the collector of the NPN transistor 46-3. The emitters of the NPN transistors 46-1 and 46-2 are connected to each other. The constant current source 47 is coupled between the ground Vss and the node of the emitters of the NPN transistors 46-1 and 46-2. The node of the collectors of the NPN transistors 46-1 and 46-2 is connected to one of the two input nodes of a differential amplifier 33. The collector of the NPN transistor 46-3 is coupled to the other input node of the differential amplifier 33.

When a select signal SS1 is at an "L" level, and a select signal SS2 is at a "H" level, the current-sensing unit 40-1 is selected. The collector potential of the NPN transistor 29-1 is either at the "H" level or the logic "L" level, in accordance with the data stored in any selected memory cell of the cell-array block 11-1 connected to the emitter of the NPN transistor 29-1. On the other hand, the collector of the NPN transistor 29-2 is at the "1" level, whatever data is stored in any selected memory cell of the cell-array block 11-2 connected to the emitter of the NPN transistor 29-2. Hence, the data stored in the memory-cell array 11-2 does not influence the output of the differential amplifier 33. The collector potential of the NPN transistor 30 is determined by the output potential of the circuit 27. The difference between the base potentials of the transistors 46-3 and 46-1 determines the output of the differential amplifier 33.

When the select signals SS1 and SS2 are at the "H" level and the "L" level respectively, the current-sensing unit 40-2 is selected. In this case, the data is read from any selected memory cell of the cell-array block 11-2, imposing no influence on the data stored in the cell-array block 11-1.

Figure 9:
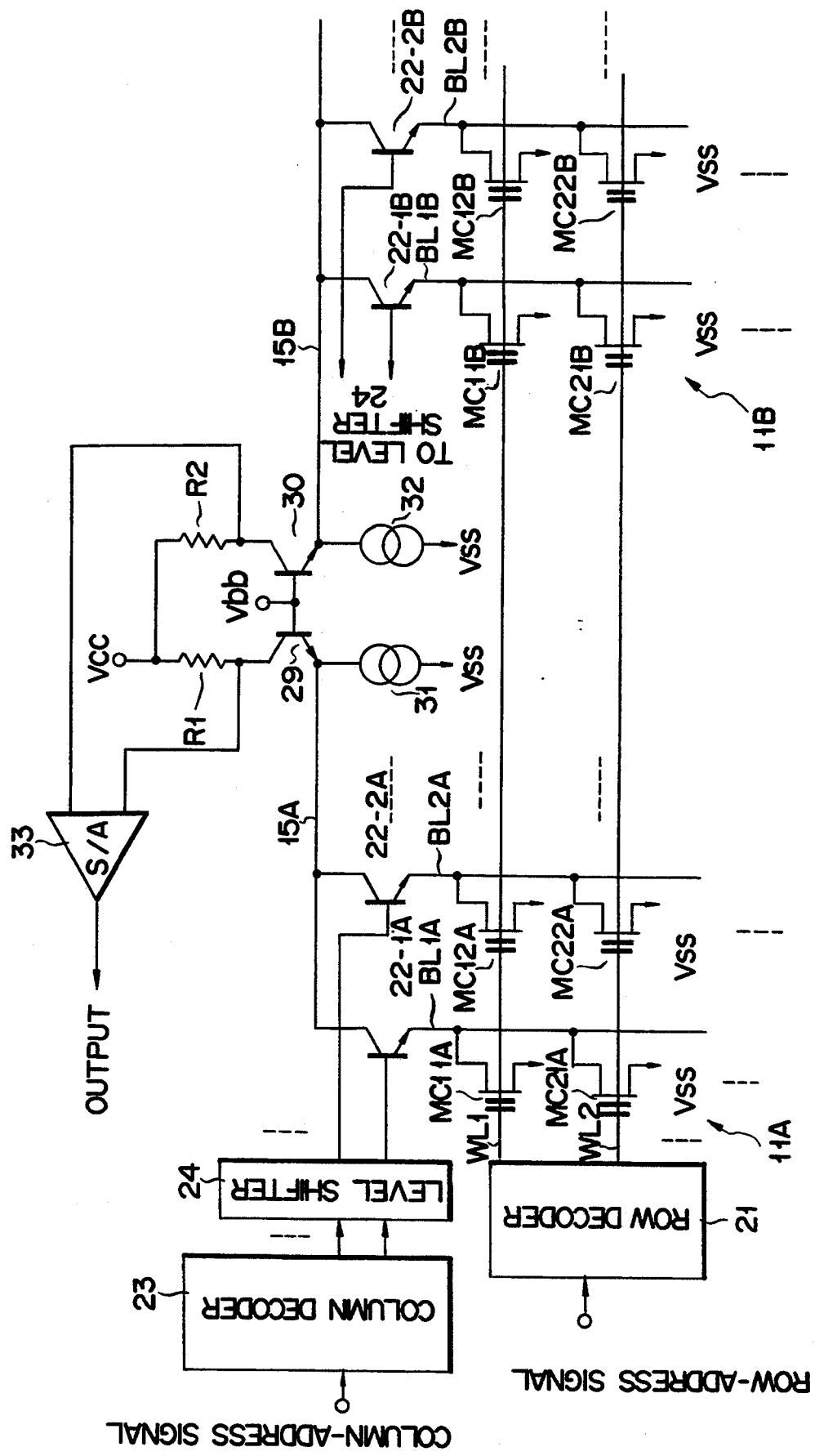
FIGS. 9, 10, 11, and 12 are circuit diagrams schematically illustrating the data-reading sections of four semiconductor memory devices according to a sixth, a seventh, an eighth, and a ninth embodiment of the invention, respectively.

The present invention is not limited to the embodiments described above, which are of the single end type. Nevertheless, this invention can be applied to such an architecture as is shown in FIG. 9, wherein two memory-cell arrays 11A and 11B are coupled to the input nodes of a current-sensing amplifier 28 by means of sense lines 15A and 15B. In this architecture, different data items are written into the corresponding cells of the arrays 11A and 11B. To read this data, the corresponding cells are selected, and the difference between the potentials of the sense lines 15A and 15B is amplified first by the current-sensing amplifier 28 and then by a differential amplifier 33.

Figure 10:
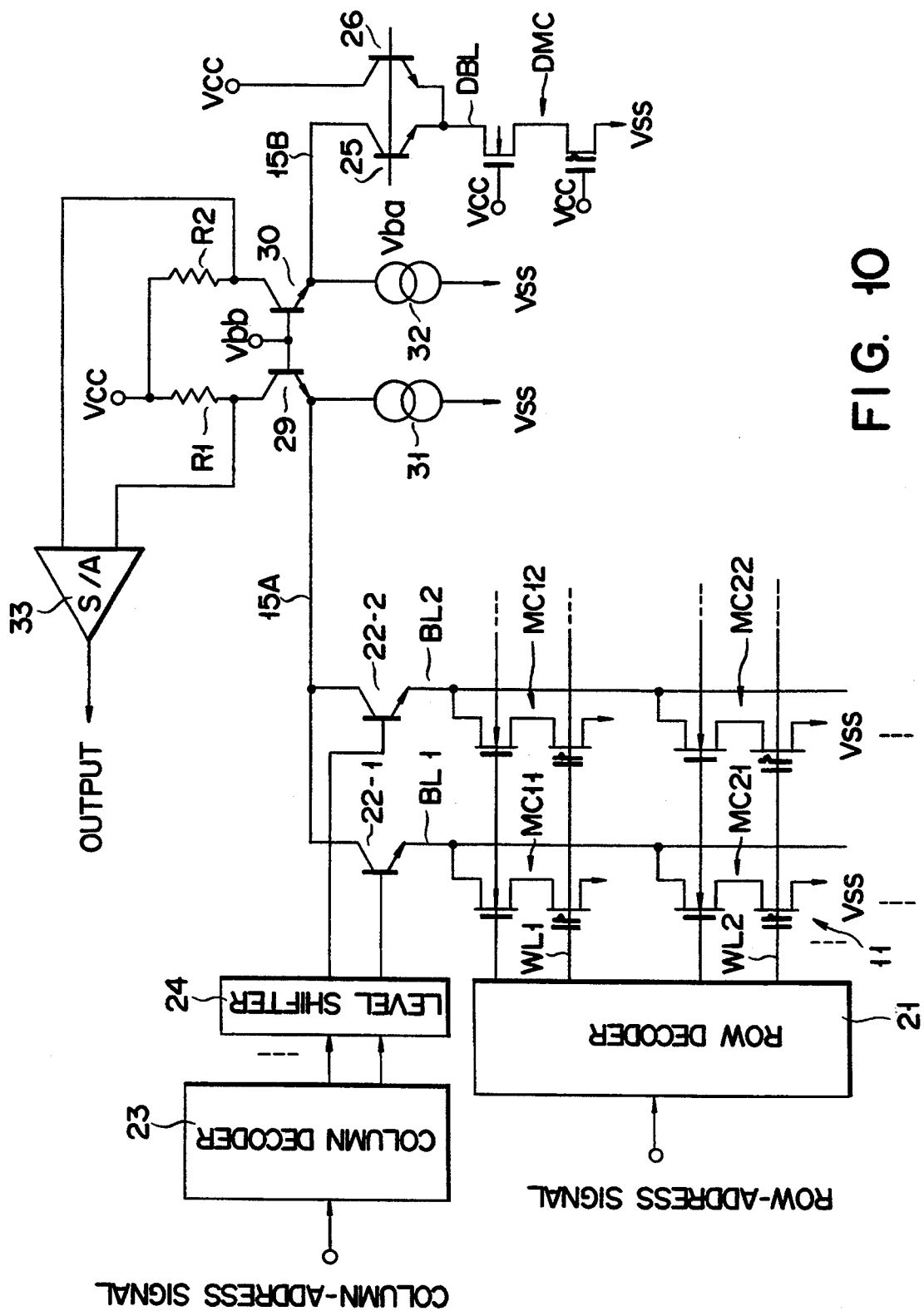
Figure 11:
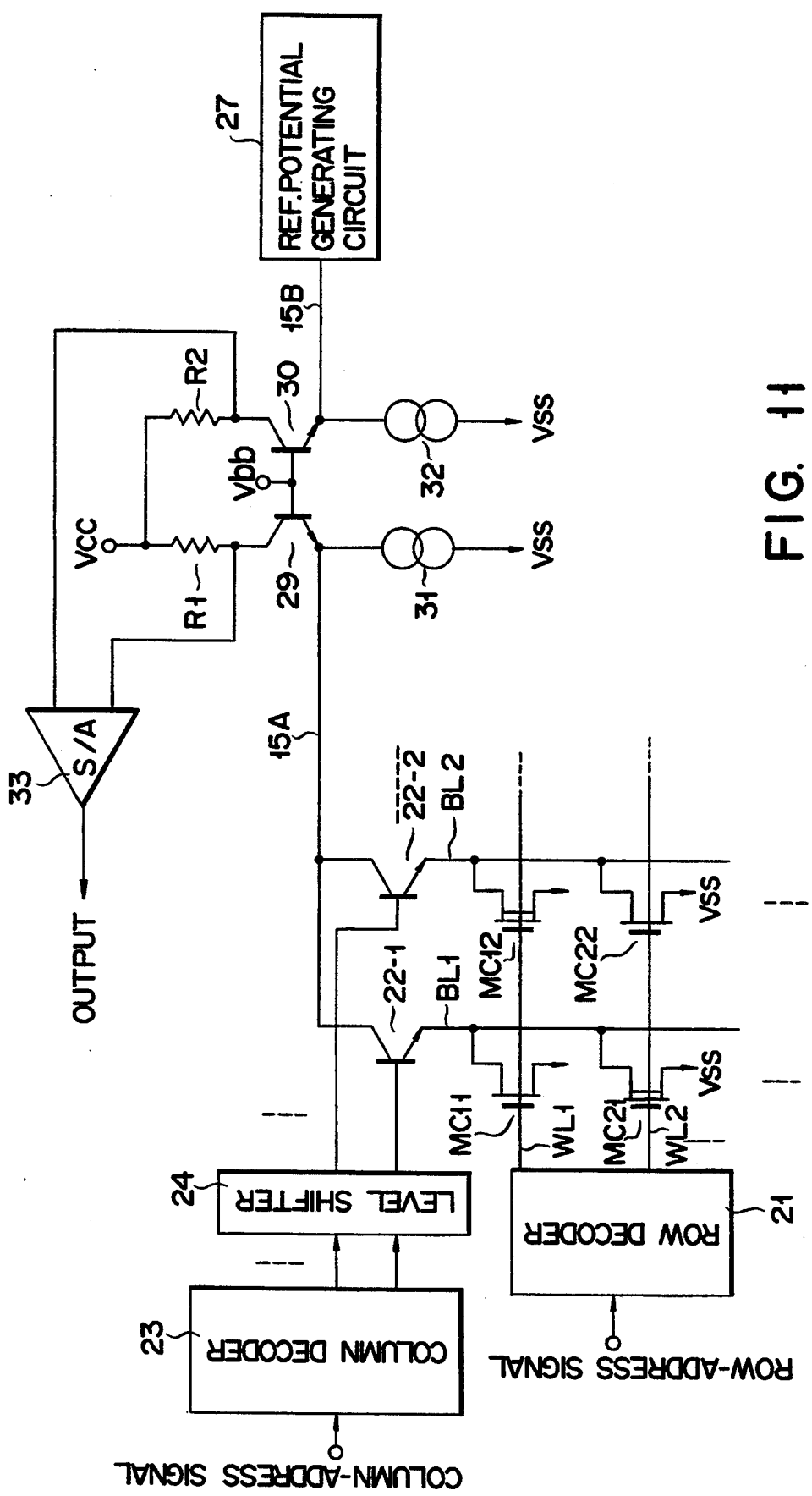
Figure 12:
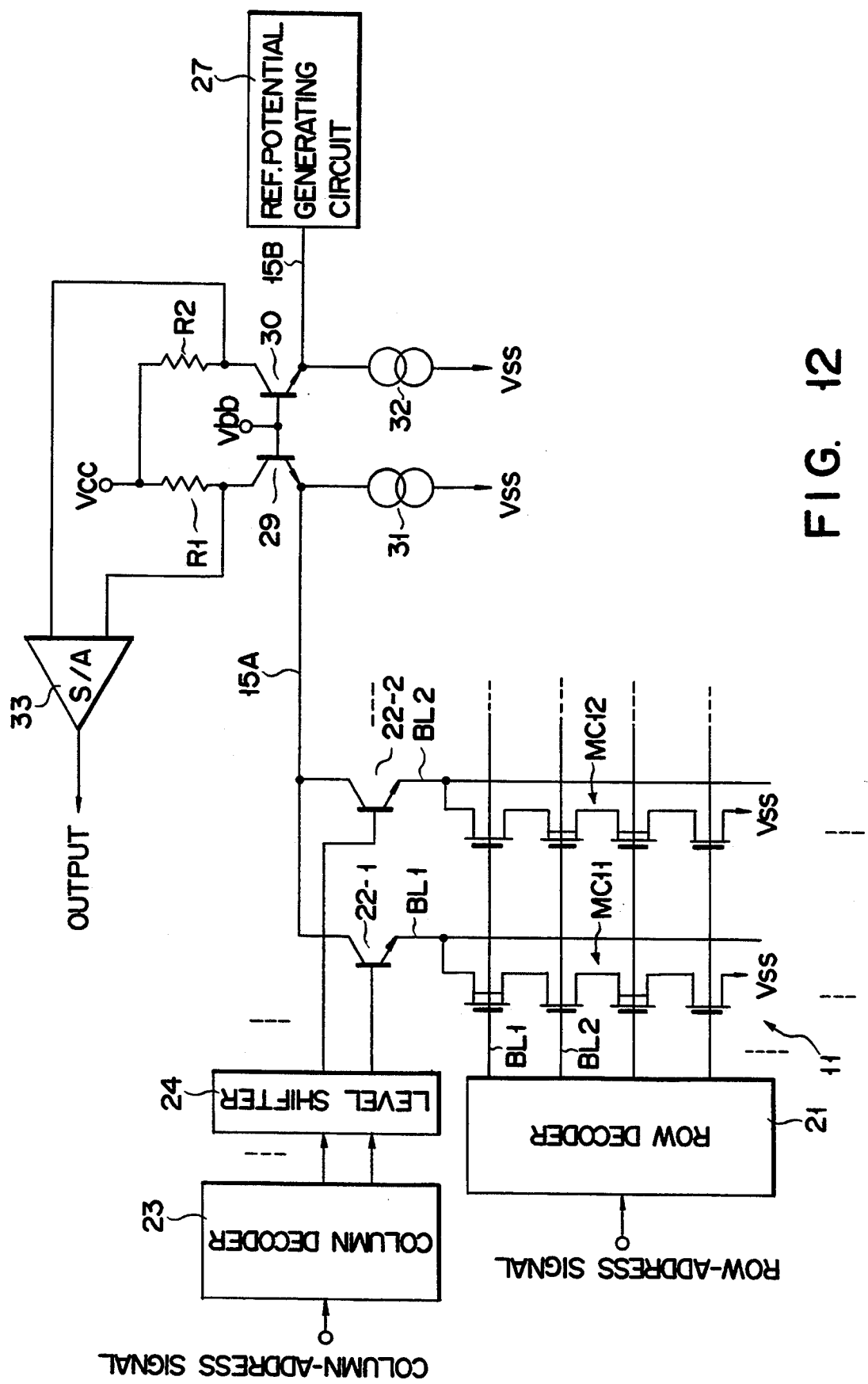

The memory cells of the embodiments described above are EPROM cells. However, they can be EEPROM cells as is shown in FIG. 10, mask ROM cells as is illustrated in FIG. 11, or ROM cells with NAND-cell structure as is illustrated in FIG. 12. The circuits shown in FIGS. 10, 11, and 12 are identical in both structure and operation to the embodiments described above, except for the types of the memory cells employed. Therefore, neither their structures nor their operations will be described or explained.

What is claimed is:
1. A semiconductor memory device, comprising:
a memory cell array including single-bit output type memory cells arranged in rows and columns, said single-bit output type memory cells each comprising a floating gate type MOS transistor having a source, a drain, a control gate, and a floating gate;
bit lines respectively coupled to the drains of the floating gate type MOS transistors in a column of said memory cell array;
word lines respectively coupled to the control gates of the floating gate type MOS transistors in a row of said memory cell array;
a data sense line having a potential determined in accordance with data read from memory cells of said memory cell array;
a column decoder responsive to column address data for generating a column selection signal to select a column of memory cells;
a level shifting circuit for shifting a level of the column selection signal generated by said column decoder;
a row decoder responsive to row address data for generating a row selection signal which is supplied by one of said word lines to the control gates of the memory cells in a row of said memory cell array to select a row of memory cells;
bit line selecting bipolar transistors, each bit line selecting bipolar transistor having a collector-emitter path connected between said data sense line and one of said bit lines, and a base for receiving the level-shifted column selection signal;
a reference potential line;
reference potential generating means for generating a reference potential supplied to said reference potential line, said reference potential generating means comprising:
a dummy floating gate type MOS transistor having a first current terminal coupled to a ground poten- tial, a second current terminal, and a control gate coupled to receive a power supply potential;

a first bipolar transistor having an emitter coupled to the second current terminal of said dummy floating gate type MOS transistor, a collector coupled to said reference potential line, and a base for receiving a bias signal having a potential substantially equal to a potential for selecting one of said bit line selecting bipolar transistors;

a second bipolar transistor having an emitter coupled to the second terminal of said dummy floating gate type MOS transistor, a collector coupled to the power supply potential, and a base for receiving the bias signal having the potential substantially equal to a potential for selecting one of said bit line selecting bipolar transistors;

a current-sensing amplifier for amplifying a potential difference between the reference potential supplied to said reference potential line and the potential of said data sense line and outputting first and second current-sensing amplifier output voltages, said current-sensing amplifier permitting a current to flow to one of said bit lines through said data sense line and a collector-emitter path of one of said bit line selecting transistors receiving the level-shifted column selection signal, said current-sensing amplifier including:

a third bipolar transistor having an emitter coupled to said data sense line, a base receiving a bias potential, and a collector for outputting the first current-sensing amplifier output voltage;

a fourth bipolar transistor having an emitter coupled to the collector of said first bipolar transistor, a base receiving the bias potential, and a collector for outputting the second current-sensing amplifier output voltage;

a first load coupled between the collector of said third bipolar transistor and the power supply potential;

a second load coupled between the collector of said fourth bipolar transistor and the power supply potential;

a first constant current source coupled between the emitter of said third bipolar transistor and a ground potential; and a second constant current source coupled between the emitter of said fourth bipolar transistor and the ground potential; and a differential amplifier for outputting a differential amplifier output signal and having a first input coupled to the collector of said third bipolar transistor and a second input coupled to the collector of said fourth bipolar transistor.

2. The semiconductor memory device according to claim 1, wherein said differential amplifier comprises:

a first MOS transistor of a first conductivity type having a first current terminal connected to said power supply potential, a second current terminal, and a gate receiving the first current-sensing amplifier output voltage;

a second MOS transistor of the first conductivity type having a first current terminal connected to said power supply potential, a second current terminal, and a gate receiving said second current-sensing amplifier output voltage; and a current mirror circuit coupled to the second terminals of said first and second MOS transistors, wherein said differential amplifier output signal is output from a node between the second terminal of one of said first and second MOS transistors and said current mirror circuit.

3. The semiconductor memory device according to claim 2, wherein said current mirror circuit comprises MOS transistors of a second conductivity type.

4. The semiconductor memory device according to claim 1, wherein said memory cells comprise EEPROM cells.

5. The semiconductor memory device according to claim 1, wherein said memory cells comprise MASK ROM cells.

6. The semiconductor memory device according to claim 1, wherein said memory cells comprise EPROM cells.

7. The semiconductor memory device according to claim 1, further comprising:

rectifying elements connected in parallel to at least one of said first and second loads.

8. The semiconductor memory device according to claim 1, wherein an emitter area of said second bipolar transistor is substantially equal to an emitter area of said first bipolar transistor.

9. The semiconductor memory device according to claim 1, wherein an emitter area of each of said first and second bipolar transistors is larger than an emitter area of said bit line selecting transistors.

10. A semiconductor memory device, comprising:

a memory cell array including single-bit output type memory cells arranged in rows and columns, said single-bit output type memory cells each comprising a floating gate type MOS transistor having a source, a drain, a control gate, and a floating gate;

bit lines respectively coupled to the drains of the floating gate type MOS transistors in a column of said memory cell array;

word lines respectively coupled to the control gates of the floating gate type MOS transistors in a row of said memory cell array;

a data sense line having a potential determined in accordance with data read from memory cells of said memory cell array;

a column decoder responsive to column address data for generating a column selection signal to select a column of memory cells;

a level shifting circuit for shifting a level of the column selection signal generated by said column decoder;

a row decoder responsive to row address data for generating a row selection signal which is supplied by one of said word lines to the control gates of the memory cells in a row of said memory cell array to select a row of memory cells;

bit line selecting bipolar transistors, each bit line selecting bipolar transistor having a collector-emitter path connected between said data sense line and one of said bit lines, and a base for receiving the level-shifted column selection signal;

a reference potential line;

reference potential generating means for generating a reference potential supplied to said reference potential line, said reference potential generating means comprising:

a dummy floating gate type MOS transistor having a first current terminal coupled to a ground potential, a second current terminal, and a control gate coupled to receive a power supply potential;

first bipolar transistors, each first bipolar transistor having an emitter coupled to the second terminal of said dummy floating gate type MOS transistor, a collector coupled to said reference potential line, and a base for receiving a bias signal having a potential substantially equal to a potential for selecting one of said bit line selecting bipolar transistors;

second bipolar transistors, each second bipolar transistor having an emitter coupled to the second terminal of said dummy floating gate type MOS transistor, a collector coupled to said power supply potential, and a base for receiving a bias signal having the potential substantially equal to the potential for selecting one of said bit line selecting bipolar transistors;

a current-sensing amplifier for amplifying a potential difference between the reference potential supplied to said reference potential line and the potential of said data sense line and outputting first and second current-sensing amplifier output voltages, said current-sensing amplifier permitting a current to flow to one of said bit lines through said data sense line and a collector-emitter path of one of said bit line selecting bipolar transistors receiving the level-shifted column selection signal, said current-sensing amplifier including:

a third bipolar transistor having an emitter coupled to said data sense line, a base receiving a bias potential, and a collector for outputting the first current-sensing amplifier output voltage;

a fourth bipolar transistor having an emitter coupled to the collector of said first bipolar transistor, a base receiving the bias potential, and a collector for outputting the second current-sensing amplifier output voltage;

a first load coupled between the collector of said third bipolar transistor and said power supply potential;

a second load coupled between said collector of said fourth bipolar transistor and said power supply potential;

a first constant current source coupled between the emitter of said third bipolar transistor and a ground potential; and a second constant current source coupled between the emitter of said fourth bipolar transistor and said ground potential; and a differential amplifier outputting a differential amplifier output signal and having a first input coupled to the collector of said third bipolar transistor and a second input coupled to the collector of said fourth bipolar transistor, wherein a number of first bipolar transistors is different than a number of second bipolar transistors.

11. The semiconductor memory device according to claim 10, wherein said differential amplifier comprises:

a first MOS transistor of a first conductivity type having a first current terminal connected to said power supply potential, a second current terminal, and a gate receiving said first current-sensing amplifier output voltage;

a second MOS transistor of the first conductivity type having a first current terminal connected to said power supply potential, a second current terminal, and a gate receiving said second current-sensing amplifier output voltage; and a current mirror circuit coupled to the second terminals of said first and second MOS transistors, wherein said differential amplifier output signal is output from a node between the second terminal of one of said first and second MOS transistors and said current mirror circuit.

12. The semiconductor memory device according to claim 11, wherein said current mirror circuit comprises MOS transistors of a second conductivity type.

13. The semiconductor memory device according to claim 10, wherein said memory cells comprise EEPROM cells.

14. The semiconductor memory device according to claim 10, wherein said memory cells comprise MASK ROM cells.

15. The semiconductor memory device according to claim 10, wherein said memory cells comprise EPROM cells.

16. A semiconductor memory device, comprising:

a first memory cell array including single-bit output type memory cells arranged in rows and columns, said single-bit output type memory cells each comprising floating gate type MOS transistors having a source, a drain, a control gate, and a floating gate; first bit lines respectively coupled to the drains of the floating gate type MOS transistors in a column of said first memory cell array; first word lines respectively coupled to the control gates of the floating gate type MOS transistors in a row of said first memory cell array; a first data sense line having a potential determined in accordance with data read from memory cells of said first memory cell array;

a second memory cell array including single-bit output type memory cells arranged in rows and columns, said single-bit output type memory cells each comprising a floating gate type MOS transistor having a source, a drain, a control gate, and a floating gate; second bit lines respectively coupled to the drains of the floating gate type MOS transistors in a column of said second memory cell array;

second word lines respectively coupled to the control gates of the floating gate type MOS transistors in a row of said second memory cell array; a second data sense line having a potential determined in accordance with data read from memory cells of said second memory cell array;

a column decoder responsive to column address data for generating a column select signal to select a column of memory cells;

a level shifting circuit for shifting a level of the column selection signal generated by said column decoder; a row decoder responsive to row address data for generating a row selection signal which is supplied by one of said first and second word lines to the control gates of the memory cells in a row of said first or second memory cell array to select a row of memory cells;

bit line selecting bipolar transistors, each bit line selecting bipolar transistor having a collector-emitter path connected between one of said first and second bit lines and one of said first and second data sense lines, and a base for receiving the level-shifted column selection signal;

a current-sensing amplifier for amplifying a potential difference between the potential of said first data sense line and the potential of said second data sense line and outputting first and second current-sensing amplifier voltages, said current-sensing amplifier permitting a current to flow to one of said first and second bit lines through one of said first and second data sense lines and a collector-emitter path of one of said bit line selecting bipolar transistors receiving the level-shifted column selection signal, said current-sensing amplifier including:

a first bipolar transistor having an emitter coupled to said first data sense line, a base receiving a bias potential, and a collector for outputting the first current-sensing amplifier output voltage;

a second bipolar transistor having an emitter coupled to the collector of said second data sense line, a base receiving the bias potential, and a collector outputting the second current-sensing amplifier output voltage;

a first load coupled between the collector of said first bipolar transistor and a power supply potential;

a second load coupled between the collector of said second bipolar transistor and said power supply potential;

a first constant current source coupled between the emitter of said first bipolar transistor and a ground potential and;

a second constant current source coupled between the emitter of said second bipolar transistor and said ground potential; and a differential amplifier outputting a differential amplifier output signal and having a first input coupled to said collector of said first bipolar transistor and a second input coupled to said collector of said second bipolar transistor.

17. The semiconductor memory device according to claim 16, wherein said differential amplifier comprises:

a first MOS transistor of a first conductivity type having a first current terminal connected to said power supply potential, a second current terminal, and a gate receiving said first current-sensing amplifier output voltage;

a second MOS transistor of the first conductivity type having a first current terminal connected to said power supply potential, a second terminal, and a gate receiving said second current-sensing amplifier output voltage; and a current mirror circuit coupled to the second terminals of said first and second MOS transistors, wherein said differential amplifier output signal is output from a node between the second current terminal of one of said first and second MOS transistors and said current mirror circuit.

18. The semiconductor memory device according to claim 17, wherein said current mirror circuit comprises MOS transistors of a second conductivity type.

19. The semiconductor memory device according to claim 16, wherein said memory cells comprise EEPROM cells.

20. The semiconductor memory device according to claim 16, wherein said memory cells comprise MASK ROM cells.

21. The semiconductor memory device according to claim 16, wherein said memory cells comprise EPROM cells.

22. A semiconductor memory device, comprising:

a memory cell array including single-bit output type memory cells arranged in rows and columns and having a plurality of memory cell blocks, said single-bit output type memory cells each comprising a floating gate type MOS transistors having a source, a drain, a control gate, and a floating gate;

bit lines respectively coupled to the drains of the floating gate type MOS transistors in a column of said memory cell array;

word lines respectively coupled to the control gates of the floating gate type MOS transistors in a row of said memory cell array;

a data sense line having a potential determined in accordance with data read from memory cells of said memory cell array;

a column decoder responsive to column address data for generating a first column selection signal and a second column selection signal to select a column of memory cells;

a level shifting circuit for shifting a level of the first column selection signal generated by said column decoder;

a row decoder responsive to row address data for generating a row selection signal which is supplied by one of said word lines to the control gates of the memory cells in a row of said memory cell array to select a row of memory cells;

MOS selection transistors respectively coupled to said bit lines, each MOS selection transistor having a first current terminal coupled to a corresponding one of said bit lines, a control gate coupled to receive second column selection signals, and a second current terminal;

bipolar selection transistors respectively coupled to the MOS selection transistors of each memory cell block, each bipolar selection transistor having a base coupled to receive the level-shifted first column selection signal, and a collector-emitter path connected between said data sense line and the second current terminals of the MOS selection transistors of the associated memory cell block;

a reference potential line;

reference potential generating means for generating a reference potential supplied to said reference potential line, said reference potential generating means comprising:

a dummy floating gate type MOS transistor having a first current terminal coupled to a ground potential, a second terminal, and a control gate coupled to receive a power supply potential;

a first bipolar transistor having an emitter coupled to the second terminal of said dummy floating gate type MOS transistor, a collector coupled to said reference potential line, and a base for receiving a bias signal having a potential substantially equal to a potential for selecting one of said selecting bipolar transistors;

a second bipolar transistor having an emitter coupled to the second terminal of said dummy floating gate type MOS transistor, a collector coupled to the power supply potential, and a base for receiving a bias signal having a potential substantially equal to the potential for selecting one of said selecting bipolar transistors;

a current-sensing amplifier for amplifying a potential difference between the reference potential supplied to said reference potential line and the potential of said first data sense line and outputting first and second current sensing amplifier output voltages, said current-sensing amplifier permitting a current to flow to one of said bit lines through said data sense line and a collector-emitter path of one of said bipolar selection transistors receiving the level-shifted first column selection signal, said current-sensing amplifier including:

a third bipolar transistor having an emitter coupled to said data sense line, a base receiving a bias potential, and a collector for outputting the first current-sensing amplifier output voltage;

a fourth bipolar transistor having an emitter coupled to the collector of said first bipolar transistor, a base receiving the bias potential, and a collector for outputting the second current-sensing amplifier output voltage;

a first load coupled between the collector of said third bipolar transistor and said power supply potential;

a second load coupled between the collector of said fourth bipolar transistor and said power supply potential;

a first constant current source coupled between the emitter of said third bipolar transistor and a ground potential; and a second constant current source coupled between the emitter of said fourth bipolar transistor and said ground potential; and a differential amplifier outputting a differential amplifier output signal and having a first input coupled to said collector of said third bipolar transistor and a second input coupled to said collector of said fourth bipolar transistor.

23. The semiconductor memory device according to claim 22, wherein said differential amplifier comprises:

a first MOS transistor of a first conductivity type having a first current terminal connected to said power supply potential, a second current terminal, and a gate receiving said first current-sensing amplifier output voltage;

a second MOS transistor of the first conductivity type having a first current terminal connected to said power supply potential, a second current terminal, and a gate receiving said second current-sensing amplifier output voltage; and a current mirror circuit coupled to the second terminals of said first and second MOS transistors, wherein said differential amplifier output signal is output from a node between the second current terminal of one of said first and second MOS transistors and said current mirror circuit.

24. The semiconductor memory device according to claim 23, wherein said current mirror circuit comprises MOS transistors of a second conductivity type.

25. The semiconductor memory device according to claim 22, wherein said memory cells comprise EEPROM cells.

26. The semiconductor memory device according to claim 22, wherein said memory cells comprise MASK ROM cells.

27. The semiconductor memory device according to claim 22, wherein said memory cells comprise EPROM cells.

* * * * *